(12) United States Patent
Li et al.

(10) Patent No.: US 12,284,801 B2
(45) Date of Patent: Apr. 22, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Sen Li, Hefei (CN); Jun Xia, Hefei (CN); Kangshu Zhan, Hefei (CN); Tao Liu, Hefei (CN); Qiang Wan, Hefei (CN); Penghui Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 665 days.

(21) Appl. No.: 17/650,269

(22) Filed: Feb. 8, 2022

(65) Prior Publication Data

US 2022/0302127 A1 Sep. 22, 2022

Related U.S. Application Data

(63) Continuation of application No. PCT/CN2021/112606, filed on May 13, 2021.

(30) Foreign Application Priority Data

Mar. 18, 2021 (CN) .......................... 202110291509.6

(51) Int. Cl.
*H10B 12/00* (2023.01)
*H01L 21/768* (2006.01)

(52) U.S. Cl.
CPC ..... *H10B 12/482* (2023.02); *H01L 21/76814* (2013.01); *H01L 21/76852* (2013.01)

(58) Field of Classification Search
CPC ............ H10B 12/482; H01L 21/76814; H01L 21/76852
See application file for complete search history.

(56) References Cited

U.S. PATENT DOCUMENTS

| 8,697,525 B2 | 4/2014 | Kim et al. | |
|---|---|---|---|
| 8,936,982 B2 | 1/2015 | Cho et al. | |
| 10,700,206 B2 | 6/2020 | Chen et al. | |
| 2006/0113587 A1* | 6/2006 | Thies | G11C 7/18 257/E21.655 |
| 2008/0076071 A1 | 3/2008 | Lim et al. | |
| 2010/0164114 A1 | 7/2010 | Kang et al. | |
| 2011/0073925 A1* | 3/2011 | Park | H01L 21/28518 257/306 |

(Continued)

FOREIGN PATENT DOCUMENTS

| CN | 101140852 A | 3/2008 |
|---|---|---|
| CN | 103681510 A | 3/2014 |

(Continued)

*Primary Examiner* — Yasser A Abdelaziez
(74) *Attorney, Agent, or Firm* — Syncoda LLC; Feng Ma

(57) ABSTRACT

The present disclosure relates to the technical field of semiconductors, and provides a semiconductor structure and a manufacturing method thereof. The semiconductor structure includes: a substrate; a bit line located on the substrate; and a support layer located on the substrate, wherein the support layer includes a first support segment and a second support segment, the first support segment and the second support segment are both connected to the bit line, and the bit line is located between the first support segment and the second support segment.

18 Claims, 16 Drawing Sheets

(56) References Cited

U.S. PATENT DOCUMENTS

| | | | | |
|---|---|---|---|---|
| 2011/0101447 A1* | 5/2011 | Cho | ................... | H10B 12/482 |
| | | | | 438/587 |
| 2012/0211815 A1* | 8/2012 | Mikasa | ................ | H10B 12/053 |
| | | | | 257/306 |
| 2015/0056801 A1* | 2/2015 | Park | ................... | H01L 21/7682 |
| | | | | 438/655 |
| 2015/0115392 A1* | 4/2015 | Yoon | ...................... | H10B 12/03 |
| | | | | 257/499 |
| 2019/0393224 A1* | 12/2019 | Wang | ................... | H10D 1/716 |
| 2020/0066728 A1* | 2/2020 | Lu | ......................... | H10B 12/34 |
| 2020/0203354 A1 | 6/2020 | Lee et al. | | |

FOREIGN PATENT DOCUMENTS

| | | |
|---|---|---|
| CN | 102543944 B | 6/2016 |
| CN | 106876275 A | 6/2017 |
| CN | 111354711 A | 6/2020 |
| CN | 211719592 U | 10/2020 |
| CN | 113113384 A | 7/2021 |

* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2021/112606, filed on Aug. 13, 2021, which claims the priority to Chinese Patent Application 202110291509.6, titled "SEMICONDUCTOR STRUCTURE AND MANUFACTURING METHOD THEREOF" and filed on Mar. 18, 2021. The entire contents of International Application No. PCT/CN2021/112606 and Chinese Patent Application 202110291509.6 are incorporated herein by reference.

TECHNICAL FIELD

The present disclosure relates to the technical field of semiconductors, and in particular to a semiconductor structure and a manufacturing method thereof.

BACKGROUND

In the manufacturing process of semiconductor structures, as the critical dimension reduces continuously, bit lines have poor structural stability, and are prone to collapsing.

SUMMARY

The present disclosure provides a semiconductor structure and a manufacturing method thereof.

According to a first aspect of the present disclosure, a semiconductor structure is provided, including:
a substrate;
a bit line located on the substrate; and
a support layer located on the substrate, wherein the support layer includes a first support segment and a second support segment, the first support segment and the second support segment are both connected to the bit line, and the bit line is located between the first support segment and the second support segment.

According to a second aspect of the present disclosure, a method of manufacturing a semiconductor structure is provided, including:
providing a substrate;
forming a support layer on the substrate, wherein the support layer includes a first support segment and a second support segment; and
forming a bit line on the substrate, wherein the bit line is formed between the first support segment and the second support segment, and the first support segment and the second support segment are both connected to the bit line.

BRIEF DESCRIPTION OF THE DRAWINGS

The preferred embodiments of the present disclosure are described in detail below with reference to the accompanying drawings to make the objectives, features and advantages of the present disclosure more obvious. The drawings are merely exemplary illustrations of the present disclosure, and are not necessarily drawn to scale. The same reference numerals in the drawings always represent the same parts. In the drawings.

DETAILED DESCRIPTION

Figure 1:
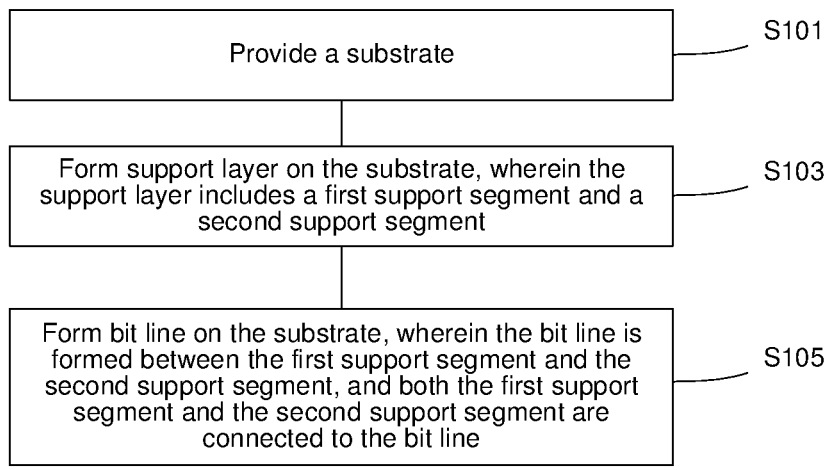
FIG. 1 is a schematic flowchart of a method of manufacturing a semiconductor structure according to an exemplary implementation.

The typical embodiments embodying the features and advantages of the present disclosure are described in detail below. It should be understood that the present disclosure may have various changes in different embodiments, which do not depart from the scope of the present disclosure. The description and drawings herein are essentially used for the purpose of explanation, rather than limiting the present disclosure.

Different exemplary embodiments of the present disclosure are described below with reference to the accompanying drawings. The accompanying drawings form a part of the present disclosure, which show by way of example different exemplary structures, systems and steps that can implement various aspects of the present disclosure. It should be understood that other specific solutions of components, structures, exemplary devices, systems and steps may be used, and structural and functional modifications may be made without departing from the scope of the present disclosure. Moreover, although the terms such as "above", "between" and "within" may be used in this specification to describe different exemplary features and elements of the present disclosure, these terms are used herein only for convenience of description, for example, according to the directions of the examples in the drawings. Nothing in this specification should be understood as requiring a specific three-dimensional direction of the structure to fall within the scope of the present disclosure.

An embodiment of the present disclosure provides a method of manufacturing a semiconductor structure. Referring to FIG. 1, the method of manufacturing a semiconductor structure includes:

S101: Provide a substrate 10.

S103: Form a support layer 30 on the substrate 10, wherein the support layer 30 includes a first support segment 31 and a second support segment 32.

S105: Form a bit line 20 on the substrate 10, wherein the bit line 20 is formed between the first support segment 31 and the second support segment 32, and both the first support segment 31 and the second support segment 32 are connected to the bit line 20.

In the method of manufacturing a semiconductor structure according to an embodiment of the present disclosure, the support layer 30 and the bit line 20 are formed on the substrate 10 sequentially. That is, the support layer 30 is formed before formation of the bit line 20. In the process of forming the bit line 20, the support layer 30 can provide a support function, thereby prevent the bit line 20 from collapsing, thus improving the performance of the semiconductor structure.

It should be noted that, the bit line 20 is formed between the first support segment 31 and the second support segment 32. That is, the support layer 30 is formed on the substrate 10 first, and then the bit line 20 is formed on the substrate 10. Due to the support function of the support layer 30, the bit line 20 can be prevented from collapsing during formation.

The substrate 10 may be made of a silicon-containing material. The substrate 10 may be made of any suitable material, including, for example, at least one of silicon, monocrystalline silicon, polysilicon, amorphous silicon, silicon-germanium, monocrystalline silicon-germanium, polycrystalline silicon-germanium, or carbon-doped silicon.

In an embodiment, the method of manufacturing a semiconductor structure further includes: before forming the support layer 30, forming an auxiliary layer 11 on the substrate 10; forming trench 12 on the auxiliary layer 11; forming a sacrificial layer 13 in the trench 12; forming openings 14 on the auxiliary layer 11, wherein the sacrificial layer 13 is located between two adjacent openings 14. The support layer 30 is formed in each of the openings 14, that is, before the bit line 20 are formed, the support layer 30 is formed in each of the openings 14 respectively, such that the support layer 30 is used as support structure for the subsequently formed bit line 20, thereby ensuring the structural stability.

Specifically, the openings 14 are multiple spaces arranged at intervals, such that the sacrificial layer 13 can be located between adjacent spaces that are spaced apart; after the support layer 30 is formed in each of the openings 14, the sacrificial layer 13 is clamped by the support layer 30, such that the support layer 30 can support the bit line 20 in the subsequent formation of the bit line 20.

In an embodiment, the sacrificial layer 13 is removed, and at least a part of the bit line 20 is formed in the trench 12. That is, the bit line 20 is formed between support segments of the support layer 30, thereby ensuring that the bit line 20 will not collapse during formation.

In some embodiments, an extension direction of the openings 14 which is parallel to the substrate 10 is perpendicular to an extension direction of the trench 12 which is parallel to the substrate 10, such that an extension direction of the support layer 30 which is parallel to the substrate 10 is perpendicular to an extension direction of the sacrificial layer 13 which is parallel to the substrate 10. The support layer 30 intersect the sacrificial layer 13. The support layer 30 includes multiple support segments spaced apart, while the sacrificial layer 13 is an integrated layer.

In an embodiment, the auxiliary layer 11 includes a bit line contact layer 111 and a dielectric layer 112. The bit line contact layer 111 is formed on the substrate 10, and the dielectric layer 112 is formed on the bit line contact layer 111. The trench 12 exposes the bit line contact layer 111, and the opening 14 expose the substrate 10. The forming the bit line 20 includes: forming a barrier layer 21 in the trench 12; forming a conductive layer 22 in the trench 12, wherein the conductive layer 22 covers the barrier layer 21; forming a covering layer 23 in the trench 12, wherein the covering layer 23 covers the conductive layer 22; removing the dielectric layer 112, and the bit line contact layer 111 that is located on two sides of the support layer 30, wherein the remaining bit line contact layer 111 is used as a bit line contact structure 24; the bit line contact structure 24, the barrier layer 21, the conductive layer 22, and the covering layer 23 are used as the bit line 20.

Specifically, the bit line 20 comprises the bit line contact structure 24, the barrier layer 21, the conductive layer 22, and the covering layer 23, the bit line contact structure 24, the barrier layer 21, the conductive layer 22, and the covering layer 23 are sequentially arranged from bottom to top. After the sacrificial layer 13 in the trench 12 is removed, the barrier layer 21, the conductive layer 22, and the covering layer 23 are sequentially formed in the trench 12; after a part of the bit line contact layer 111 is removed, the remaining bit line contact layer 111 is used as the bit line contact structure 24, thereby forming the whole bit line 20. In this case, the bit line 20 is clamped in the support layer 30.

Specifically, the bit line 20 is of a laminated structure, wherein a material of the barrier layer 21 may include at least one of WSi, TIN, and TI; a material of the conductive layer 22 may include W; a material of the covering layer 23 may include silicon nitride (SiN), silicon carbon nitride (SiCN), and the like; a material of the bit line contact structure 24 may include polysilicon.

The barrier layer 21, the conductive layer 22, and the covering layer 23 may be formed by using a physical vapor deposition (PVD) process, a chemical vapor deposition (CVD) process, or an atomic layer deposition (ALD) process.

In an embodiment, at least one of the trench 12 and the opening 14 is formed by self-aligned double patterning (SADP), to improve the manufacturing precision of the trench 12 and the opening 14, and increase the number of the formed trench 12 and opening 14.

Figure 2:
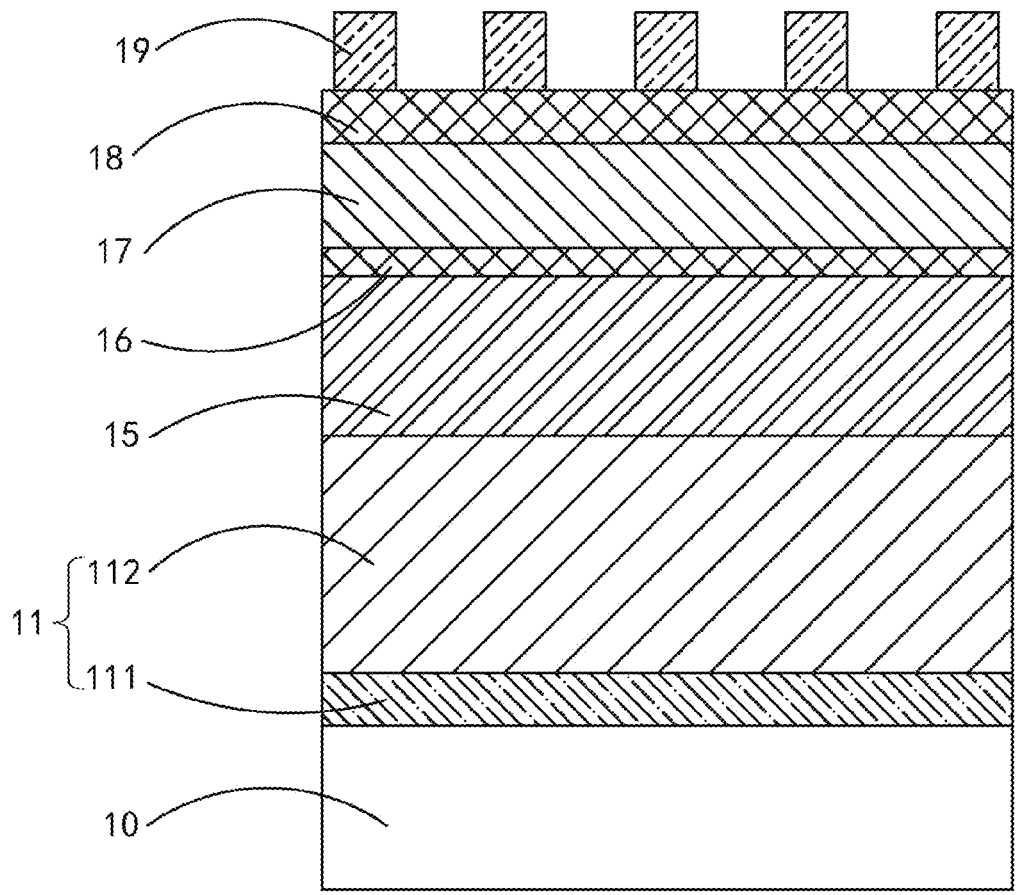
FIG. 2 is a schematic structural diagram of forming a first photoresist layer in a method of manufacturing a semiconductor structure according to an exemplary implementation.
Figure 3:
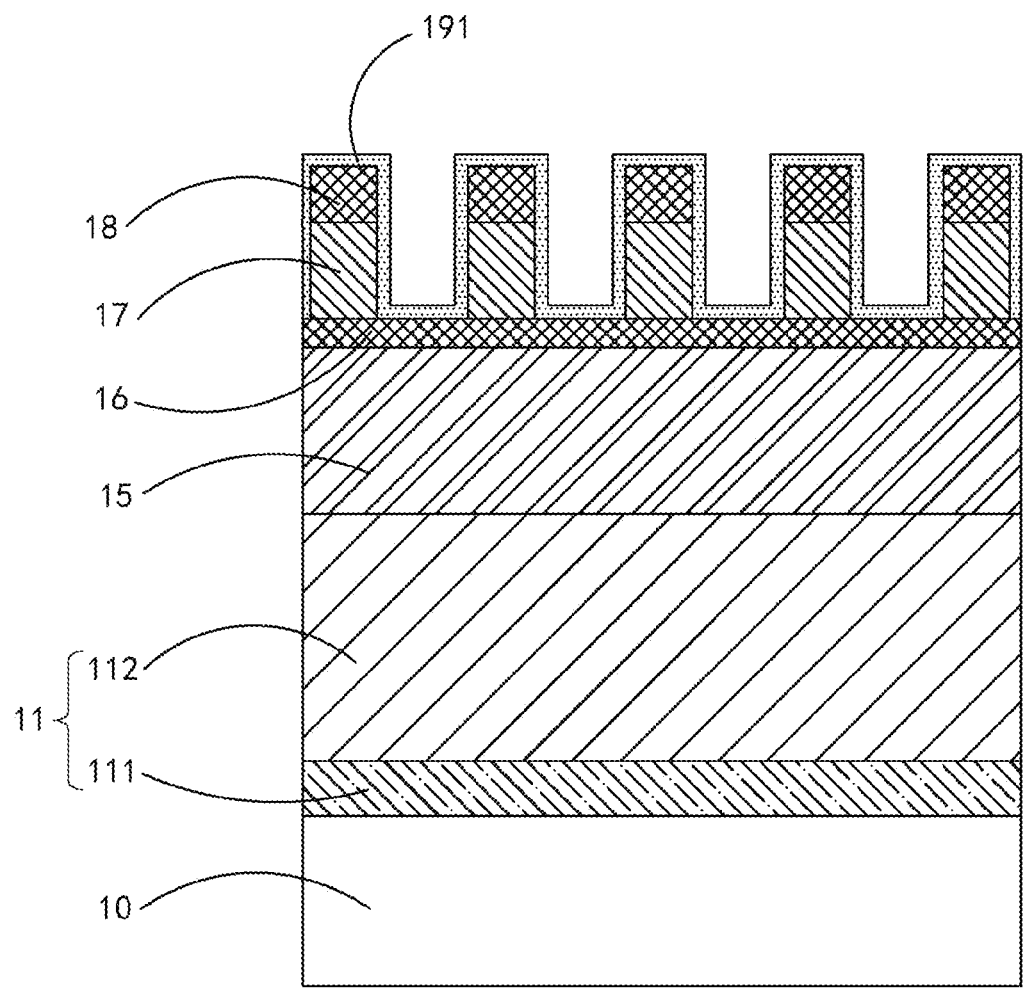
FIG. 3 is a schematic structural diagram of forming a first oxide layer in a method of manufacturing a semiconductor structure according to an exemplary implementation.
Figure 4:
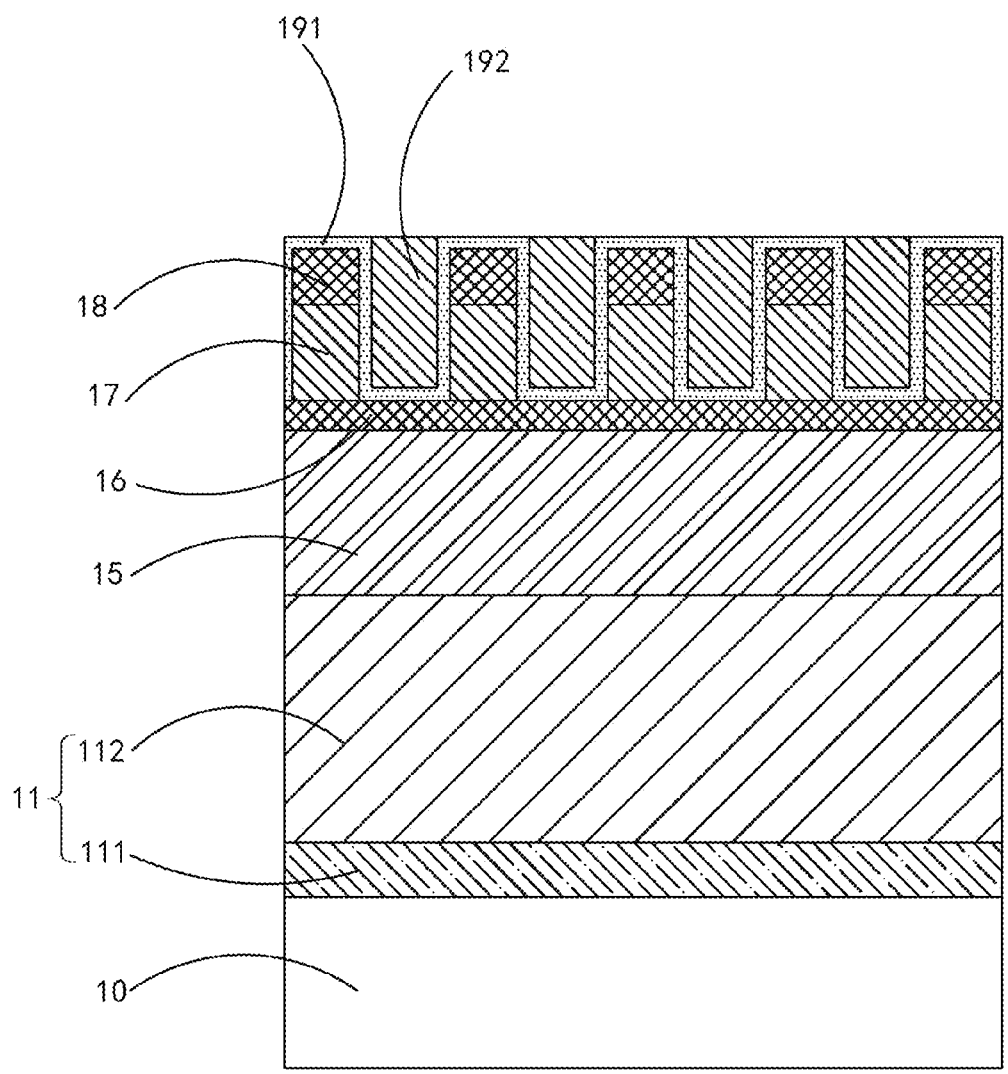
FIG. 4 is a schematic structural diagram of forming a second sacrificial dielectric layer in a method of manufacturing method of a semiconductor structure according to an exemplary implementation.

Specifically, a method for forming the trench 12 includes:
forming a first carbide layer 15 on the auxiliary layer 11, wherein the first carbide layer 15 covers an upper surface of the dielectric layer 112, and the first carbide layer 15 may include silicon carbide (SiC);
forming a first silicon oxynitride layer 16 on the first carbide layer 15, wherein the first silicon oxynitride layer 16 covers an upper surface of the first carbide layer 15;
forming a first sacrificial dielectric layer 17 on the first silicon oxynitride layer 16, wherein the first sacrificial dielectric layer 17 covers an upper surface of the first silicon oxynitride layer 16;
forming a second silicon oxynitride layer 18 on the first sacrificial dielectric layer 17, wherein the second silicon oxynitride layer 18 covers an upper surface of the first sacrificial dielectric layer 17;
forming a first photoresist layer 19 on the second silicon oxynitride layer 18, wherein the first photoresist layer 19 covers an upper surface of the second silicon oxynitride layer 18, and forming the structure shown in FIG. 2 by using a partial development method;
etching the second silicon oxynitride layer 18 and the first sacrificial dielectric layer 17 out of the region where the first photoresist layer 19 is located, to expose the first silicon oxynitride layer 16, that is, forming gaps in the second silicon oxynitride layer 18 and the first sacrificial dielectric layer 17, where specifically, a pattern in an upper layer is transferred to a lower layer by using a high-selectivity drying etching process, to form gaps in the second silicon oxynitride layer 18 and the first sacrificial dielectric layer 17;
forming a first oxide layer 191, wherein the first oxide layer 191 covers the first silicon oxynitride layer 16 and the second silicon oxynitride layer 18, that is, the first oxide layer 191 covers the upper surface of the exposed first silicon oxynitride layer 16, sidewalls of the first sacrificial dielectric layer 17, and the upper surface of the second silicon oxynitride layer 18, to form the structure shown in FIG. 3, where the first oxide layer 191 includes multiple vertical segments that extend along a direction perpendicular to the substrate 10, and the first oxide layer 191 may include silicon dioxide (SiO$_2$), silicon carbon oxide (SiOC), or other materials;
filling a second sacrificial dielectric layer 192 in the first oxide layer 191, that is, filling the gaps formed in the second silicon oxynitride layer 18 and the first sacrificial dielectric layer 17 with the first oxide layer 191 and the second sacrificial dielectric layer 192, to form the structure shown in FIG. 4;
etching the first oxide layer 191 that extends along the direction perpendicular to the substrate 10, until the bit line contact layer 111 is exposed; and
removing materials above the auxiliary layer 11, that is, removing the first carbide layer 15, the first silicon oxynitride layer 16, the first sacrificial dielectric layer 17, the second silicon oxynitride layer 18, the first photoresist layer 19, the first oxide layer 191, and the second sacrificial dielectric layer 192, to form the trench 12 on the auxiliary layer 11, that is, multiple trenches 12 are formed in the dielectric layer 112.

Figure 5:
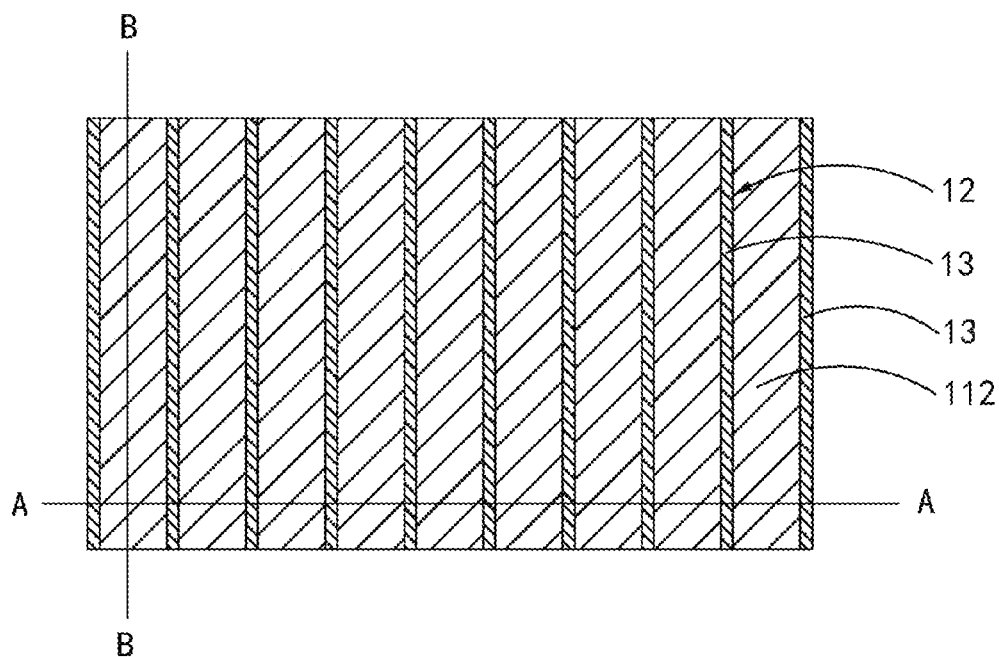
FIG. 5 is a top view of forming a sacrificial layer in a method of manufacturing method of a semiconductor structure according to an exemplary implementation.
Figure 6:
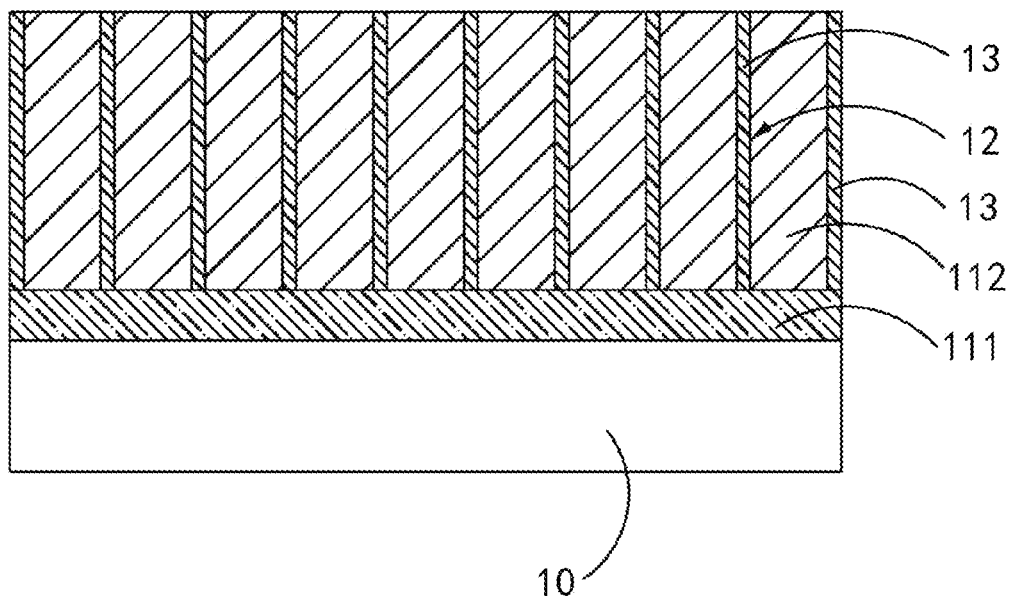
FIG. 6 is a schematic structural diagram of a cross section taken along A-A in FIG. 5.

Further, a sacrificial layer 13 is formed in each of the trench 12, that is, the trench 12 is filled with the sacrificial layer 13, to form the structure shown in FIG. 5 and FIG. 6. In this case, only the multiple trenches 12 are formed in the auxiliary layer 11, specifically as shown in FIG. 6 and FIG. 7.

It should be noted that, the first carbide layer 15, the first silicon oxynitride layer 16, the first sacrificial dielectric layer 17, the second silicon oxynitride layer 18, the first photoresist layer 19, the first oxide layer 191, and the second sacrificial dielectric layer 192 can be formed by using a physical vapor deposition (PVD) process, a chemical vapor deposition (CVD) process, an atomic layer deposition (ALD) process, etc.

Figure 7:
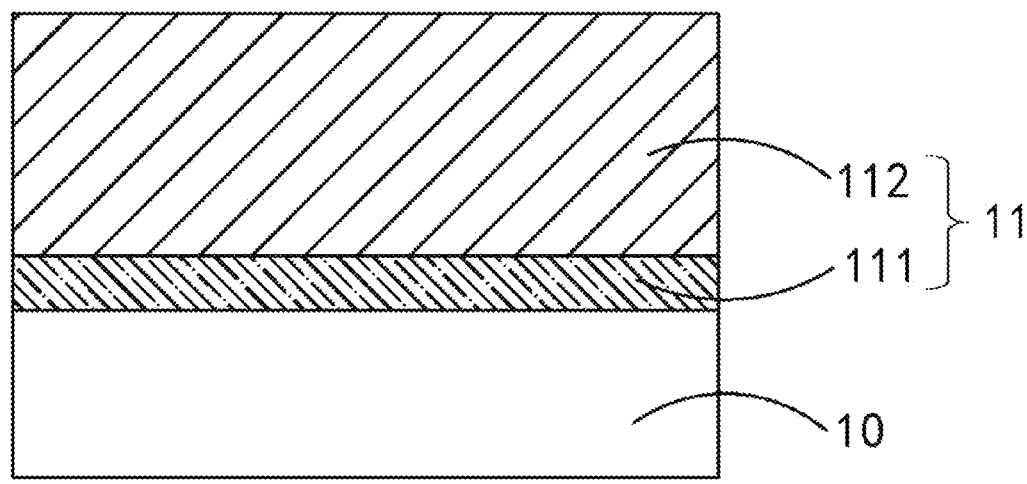
FIG. 7 is a schematic structural diagram of a cross section taken along B-B in FIG. 5.
Figure 8:
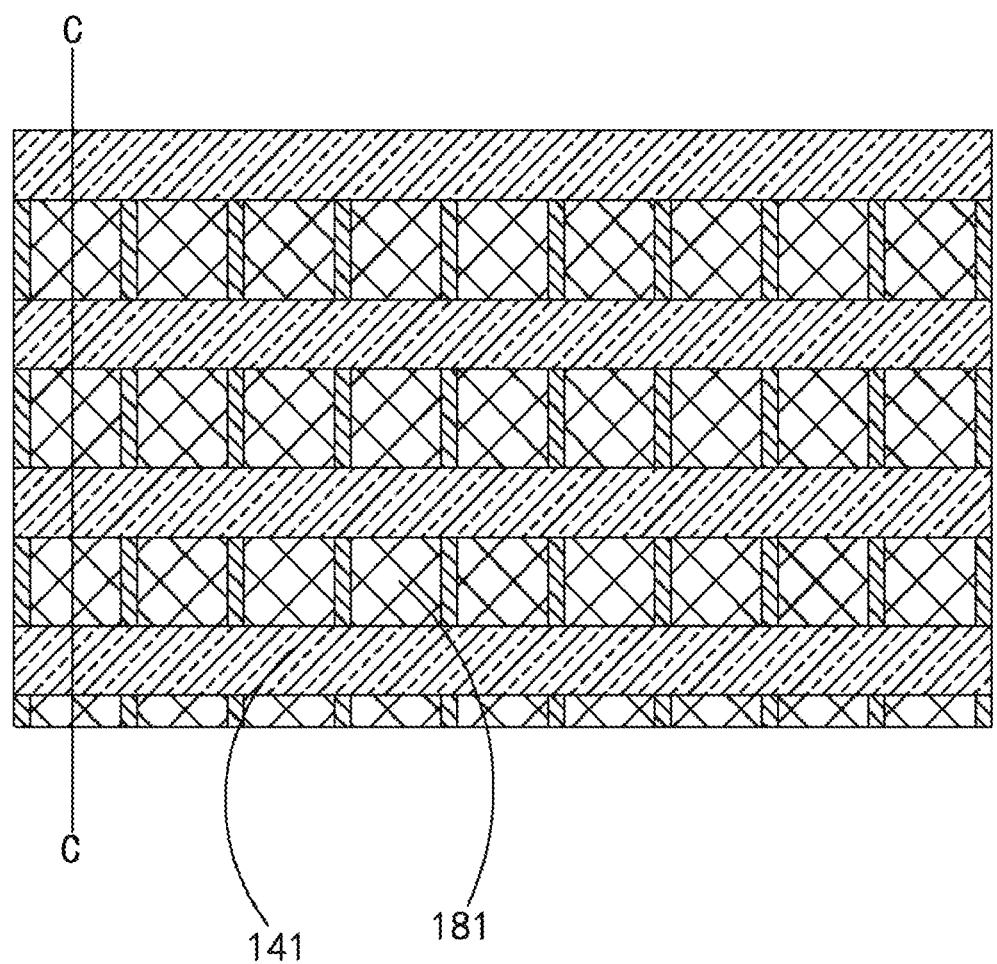
FIG. 8 is a top view of forming a second photoresist layer in a method of manufacturing method of a semiconductor structure according to an exemplary implementation.
Figure 9:
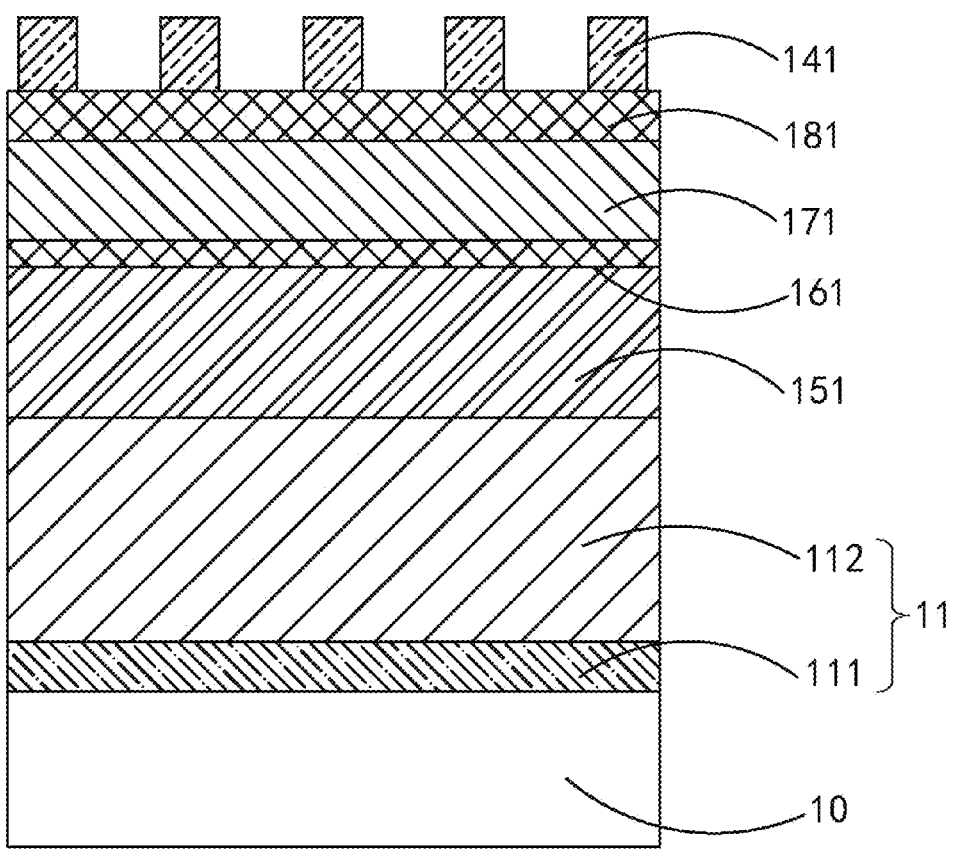
FIG. 9 is a schematic structural diagram of a cross section taken along C-C in FIG. 8.
Figure 10:
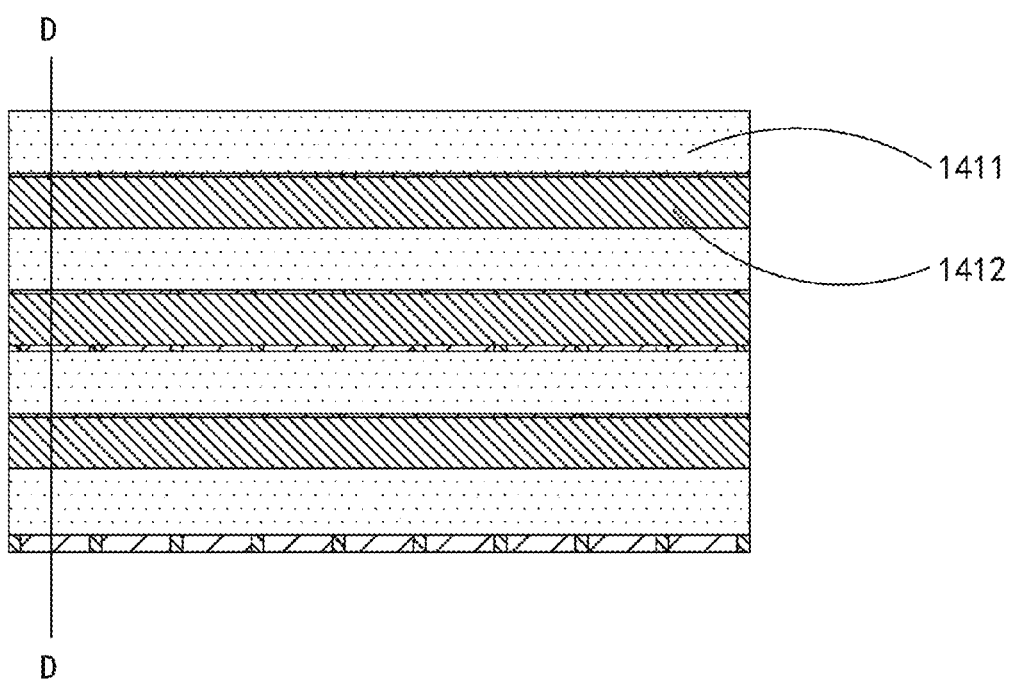
FIG. 10 is a top view of forming a fourth sacrificial dielectric layer in a method of manufacturing a semiconductor structure according to an exemplary implementation.
Figure 11:
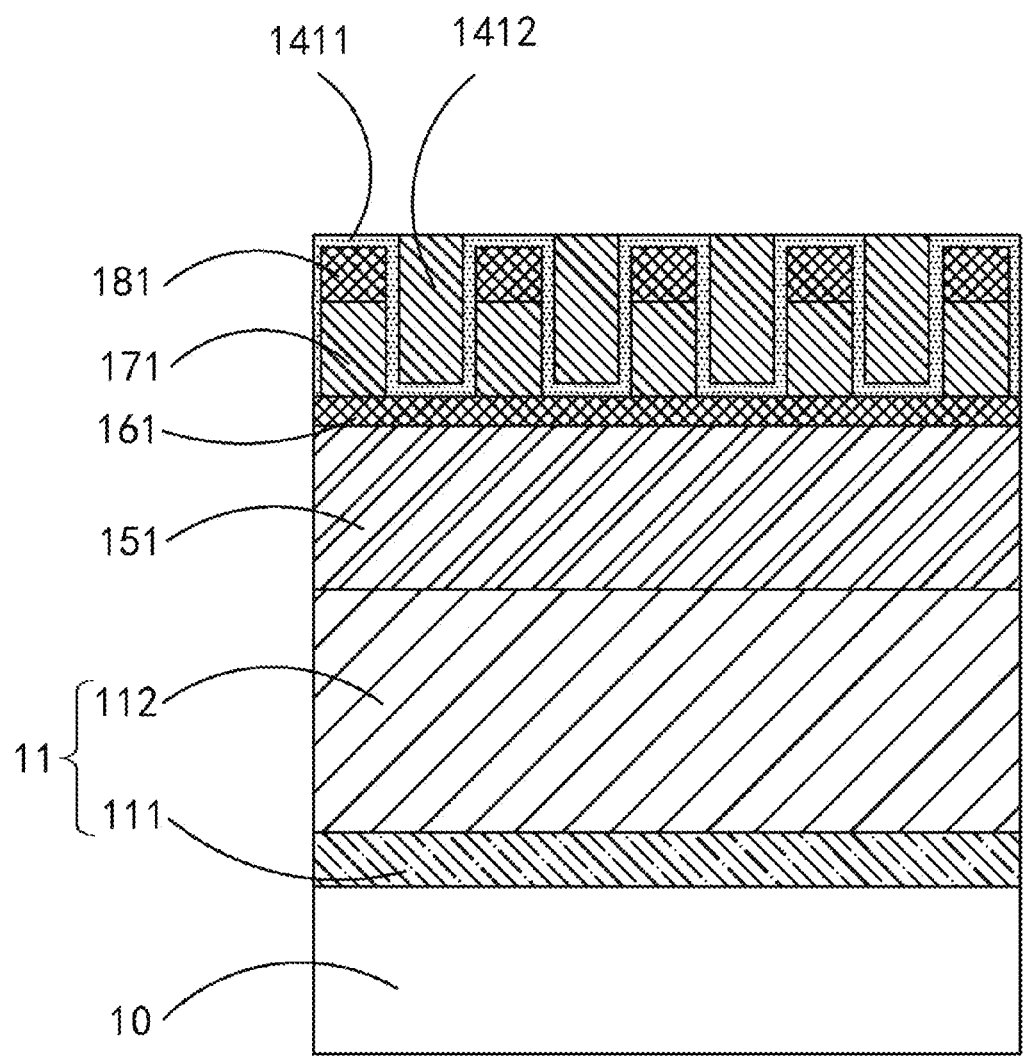
FIG. 11 is a schematic structural diagram of a cross section taken along D-D in FIG. 10.
Figure 12:
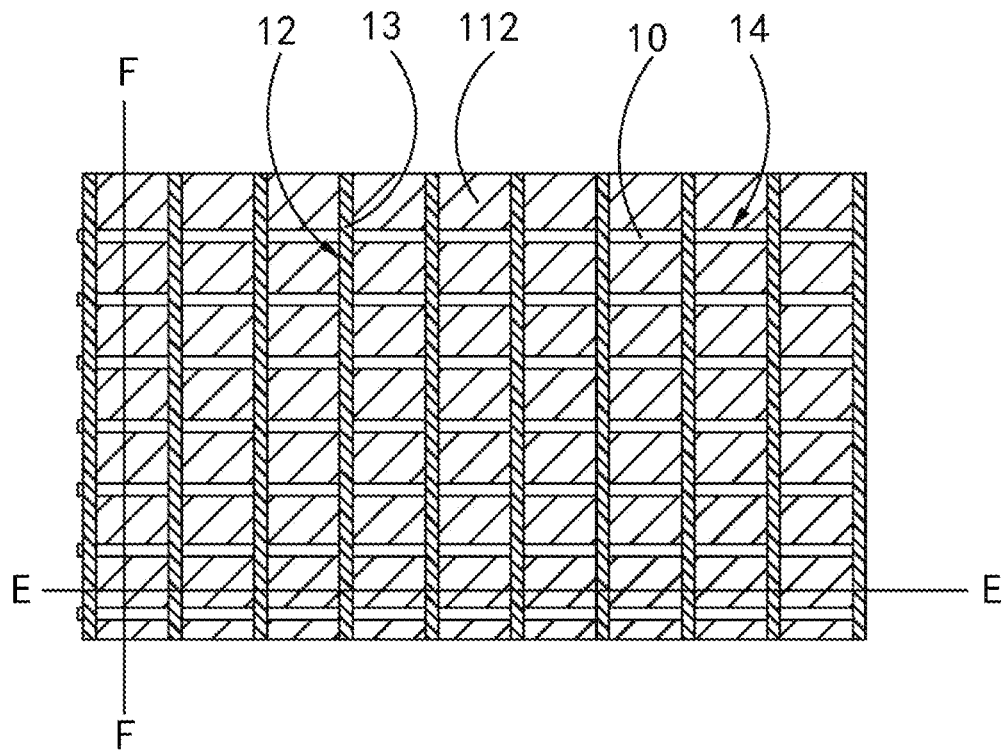
FIG. 12 is a top view of forming openings in a method of manufacturing a semiconductor structure according to an exemplary implementation.
Figure 13:
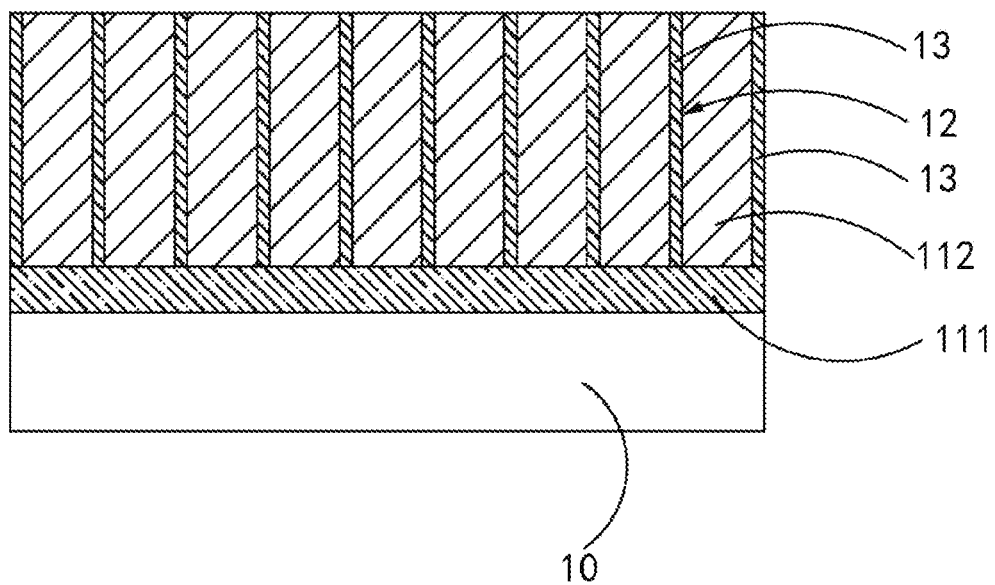
FIG. 13 is a schematic structural diagram of a cross section taken along E-E in FIG. 12.
Figure 14:
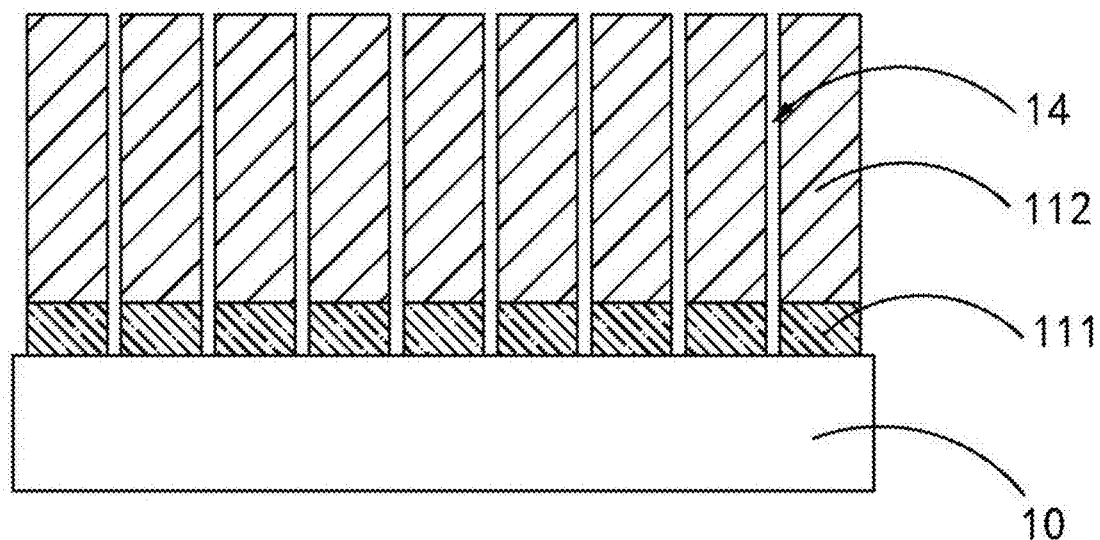
FIG. 14 is a schematic structural diagram of a cross section taken along F-F in FIG. 12.

A method for forming the opening 14 includes:
on the basis of FIG. 5 to FIG. 7, forming a second carbide layer 151 on the auxiliary layer 11, wherein the second carbide layer 151 covers an upper surface of the dielectric layer 112, and the second carbide layer 151 may include silicon carbide (SiC);
forming a third silicon oxynitride layer 161 on the second carbide layer 151, wherein the third silicon oxynitride layer 161 covers an upper surface of the second carbide layer 151;
forming a third sacrificial layer dielectric layer 171 on the third silicon oxynitride layer 161, wherein the third sacrificial layer dielectric layer 171 covers an upper surface of the third silicon oxynitride layer 161;
forming a fourth silicon oxynitride layer 181 on the third sacrificial layer dielectric layer 171, wherein the fourth silicon oxynitride layer 181 covers an upper surface of the third sacrificial layer dielectric layer 171;
forming a second photoresist layer 141 on the fourth silicon oxynitride layer 181, wherein the second photoresist layer 141 covers an upper surface of the fourth silicon oxynitride layer 181, and forming the structure shown in FIG. 8 and FIG. 9 by using a partial development method;
etching the fourth silicon oxynitride layer 181 and the third sacrificial layer dielectric layer 171 out of the region where the second photoresist layer 141 is located, to expose the third silicon oxynitride layer 161, that is, forming gaps in the fourth silicon oxynitride layer 181 and the third sacrificial layer dielectric layer 171, where specifically, a pattern in an upper layer is transferred to a lower layer by using a high-selectivity drying etching process, to form gaps in the fourth silicon oxynitride layer 181 and the third sacrificial layer dielectric layer 171;
forming a second oxide layer 1411, wherein the second oxide layer 1411 covers the third silicon oxynitride layer 161 and the fourth silicon oxynitride layer 181, that is, the second oxide layer 1411 covers the upper surface of the exposed third silicon oxynitride layer 161, sidewalls of the third sacrificial layer dielectric layer 171, and the upper surface of the fourth silicon oxynitride layer 181, the second oxide layer 1411 includes multiple vertical segments that extend along a direction perpendicular to the substrate 10, and the second oxide layer 1411 may include silicon dioxide (SiO$_2$), silicon carbon oxide (SiOC), or other materials;

filling a fourth sacrificial dielectric layer 1412 in the second oxide layer 1411, that is, filling the gap formed in the fourth silicon oxynitride layer 181 and the third sacrificial layer dielectric layer 171 with the second oxide layer 1411 and the fourth sacrificial dielectric layer 1412, to form the structure shown in FIG. 10 and FIG. 11;

etching the second oxide layer 1411 that extends along the direction perpendicular to the substrate 10, until the substrate 10 is exposed; and removing materials above the auxiliary layer 11, that is, removing the second carbide layer 151, the third silicon oxynitride layer 161, the third sacrificial layer dielectric layer 171, the fourth silicon oxynitride layer 181, the second photoresist layer 141, the second oxide layer 1411, and the fourth sacrificial dielectric layer 1412, to form the openings 14 on the auxiliary layer 11, that is, multiple openings 14 are formed in the auxiliary layer 11, thus forming the structure shown in FIG. 12 and FIG. 14, wherein in this case, the sacrificial layer 13 is provided in the trench 12, as shown in FIG. 13.

Figure 15:
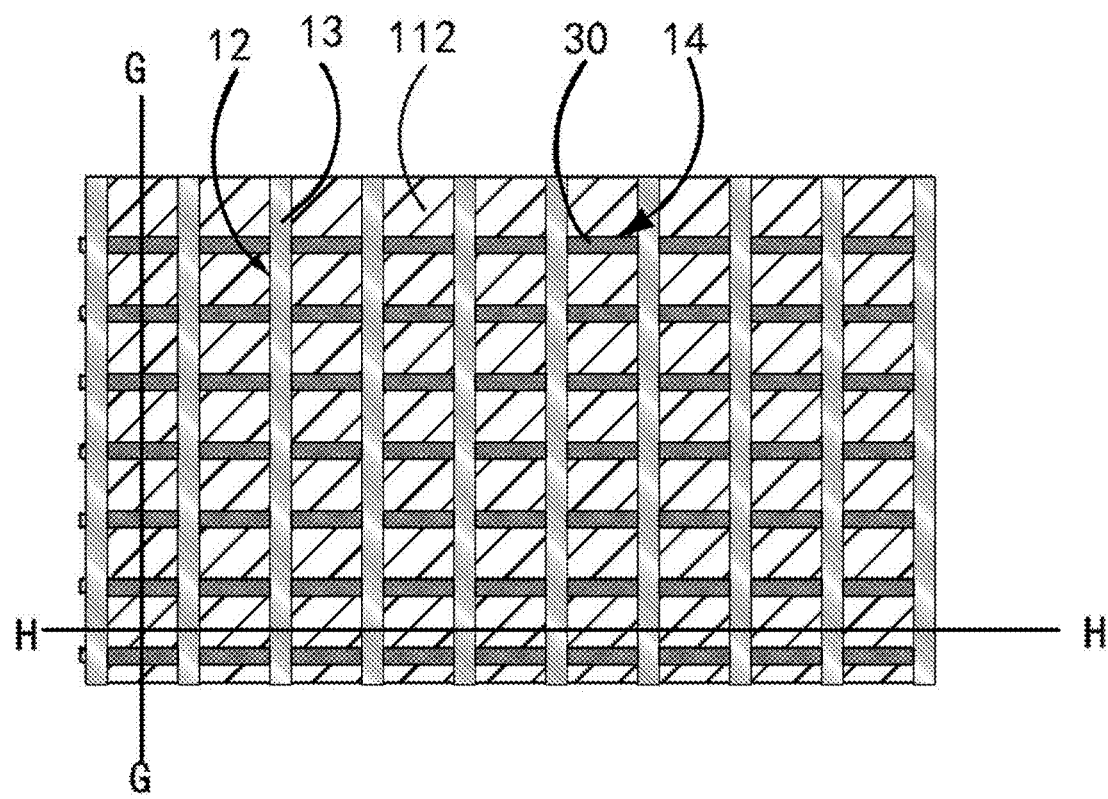
FIG. 15 is a top view of forming support layers in a method of manufacturing a semiconductor structure according to an exemplary implementation.
Figure 16:
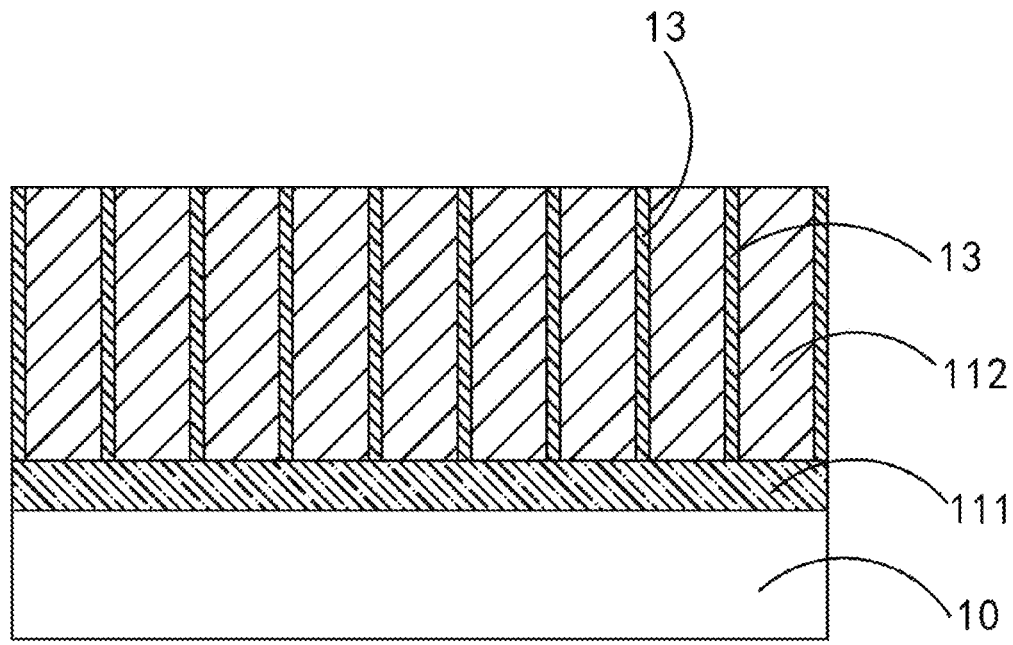
FIG. 16 is a schematic structural diagram of a cross section taken along H-H in FIG. 15.
Figure 17:
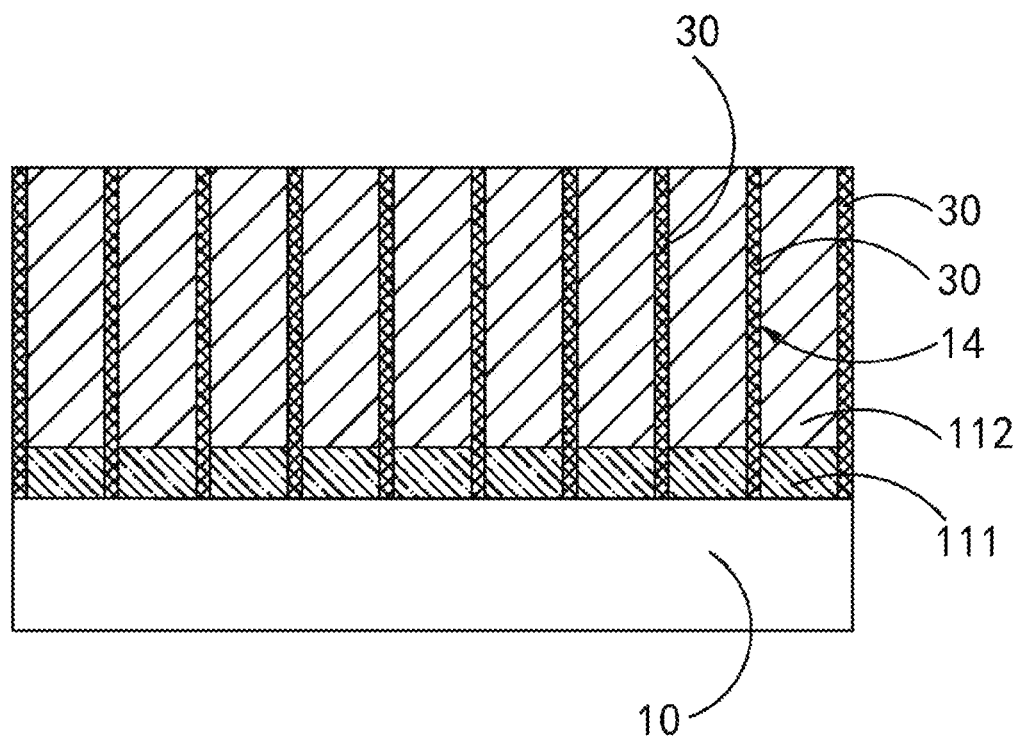
FIG. 17 is a schematic structural diagram of a cross section taken along G-G in FIG. 15.

Further, a support layer 30 is formed in opening 14, that is, the opening 14 is filled with the support layer 30, to form the structure shown in FIG. 15 and FIG. 17. In this case, the sacrificial layers 13 and the support layers 30 are formed in the auxiliary layer 11, as shown in FIG. 16 and FIG. 17.

It should be noted that, the second carbide layer 151, the third silicon oxynitride layer 161, the third sacrificial layer dielectric layer 171, the fourth silicon oxynitride layer 181, the second photoresist layer 141, the second oxide layer 1411, and the fourth sacrificial dielectric layer 1412 may be formed by using a physical vapor deposition (PVD) process, a chemical vapor deposition (CVD) process, or an atomic layer deposition (ALD) process.

Figure 18:
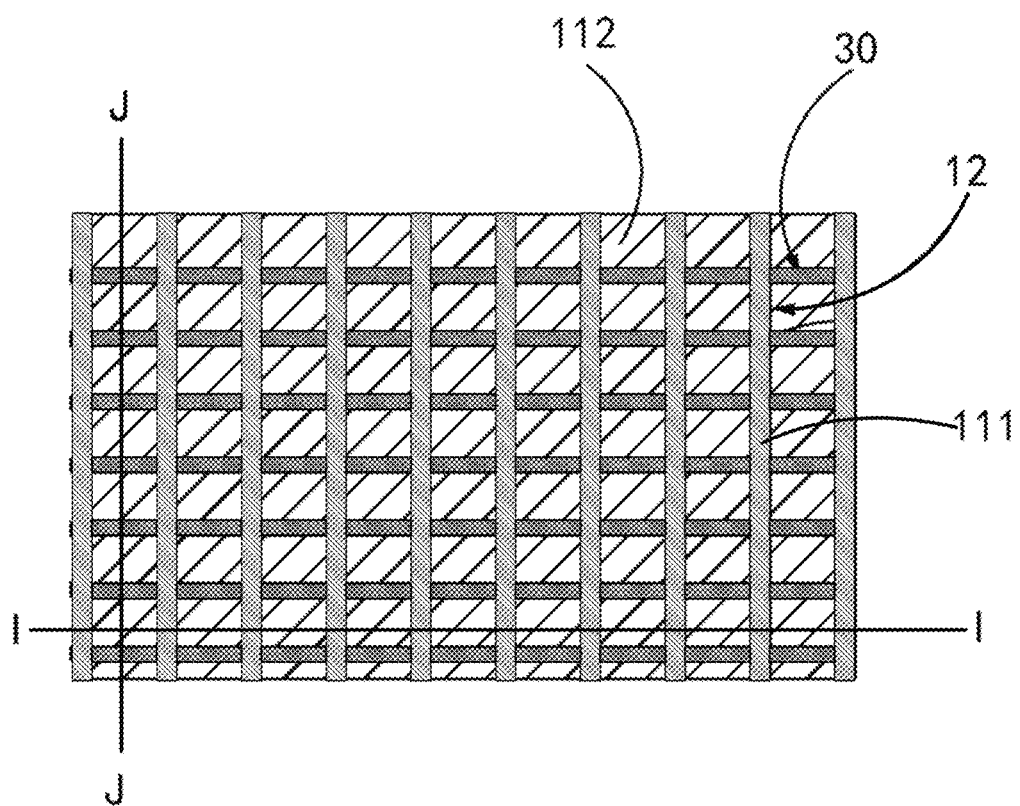
FIG. 18 is a top view of forming exposing trenches in a method of manufacturing a semiconductor structure according to an exemplary implementation.
Figure 19:
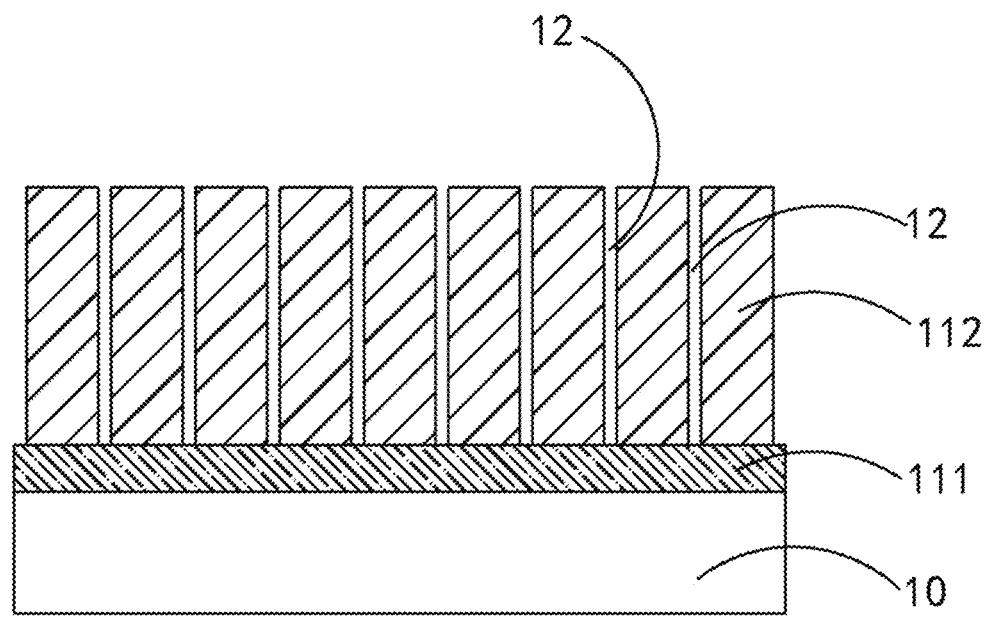
FIG. 19 is a schematic structural diagram of a cross section taken along I-I in FIG. 18.

Further, the sacrificial layer 13 in the trench 12 is removed, to form the structure shown in FIG. 18 and FIG. 19. Specifically with reference to FIG. 18 to FIG. 20, in this case, the trench 12 and the support layer 30 are formed in the auxiliary layer 11, and the trench 12 is clamped in the support layer 30.

Figure 20:
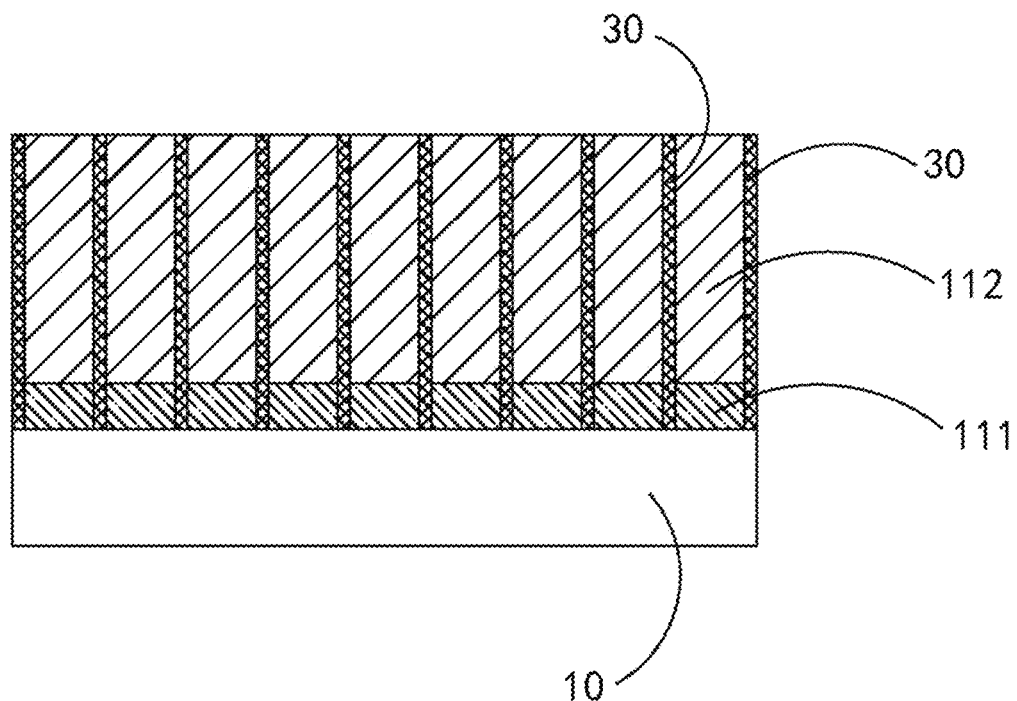
FIG. 20 is a schematic structural diagram of a cross section taken along J-J in FIG. 18.
Figure 21:
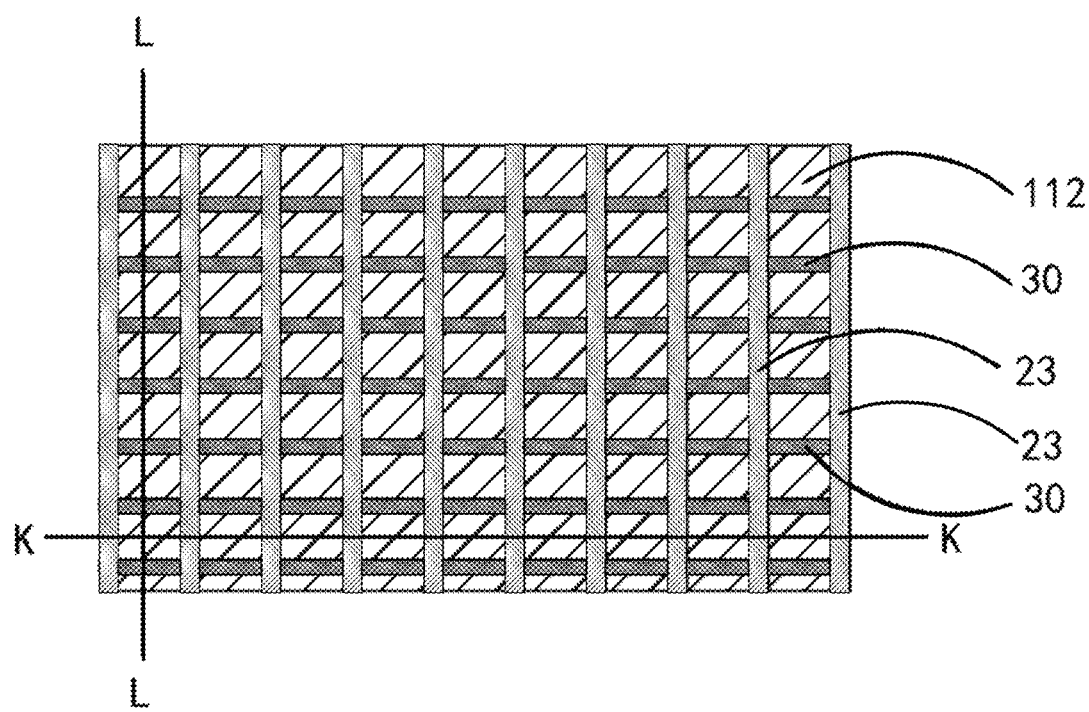
FIG. 21 is a top view of forming bit lines in a method of manufacturing a semiconductor structure according to an exemplary implementation.
Figure 22:
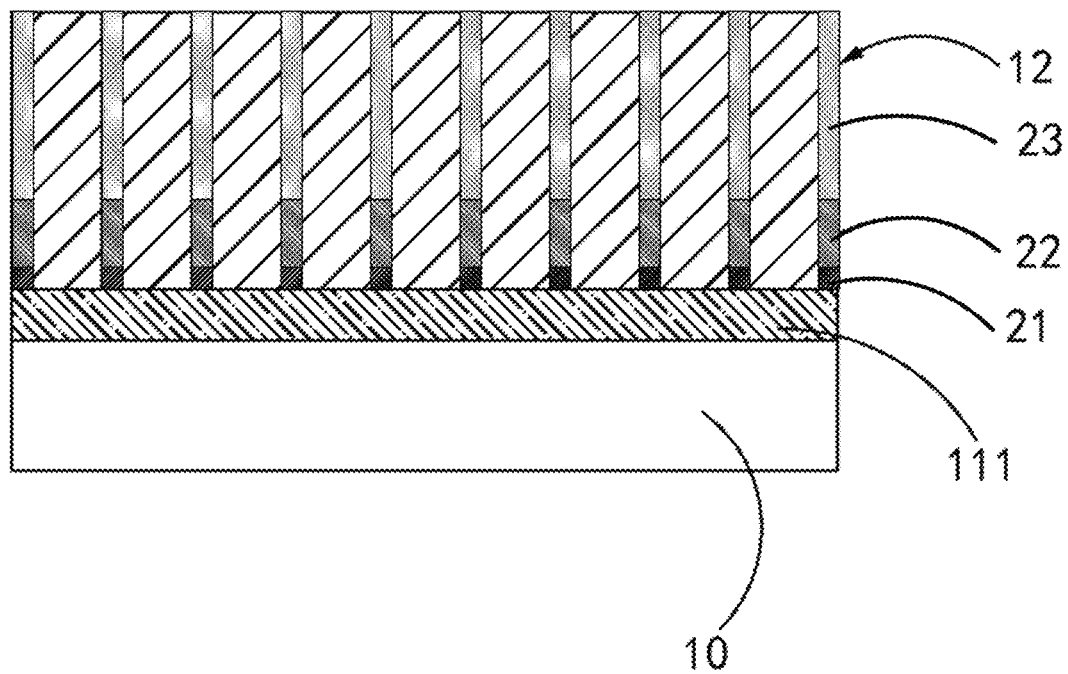
FIG. 22 is a schematic structural diagram of a cross section taken along K-K in FIG. 21.

Optionally, on the basis of FIG. 18 to FIG. 20, a barrier layer 21, a conductive layer 22, and a covering layer 23 are sequentially formed in the trench 12, as shown in FIG. 21 and FIG. 22. Specifically with reference to FIG. 21 to FIG. 23, in this case, at least a part of the bit line 20 is formed in the trench 12, the support layer 30 is formed in the opening 14, and the support layer 30 clamps the bit line 20.

In an embodiment, the method of manufacturing a semiconductor structure further includes: forming sidewall insulation layer 40 on the substrate 10, wherein the sidewall insulation layers 40 covers sidewalls of the bit line 20 and sidewalls of the support layer 30, thereby forming containing space 34 within the sidewall insulation layer 40, to facilitate subsequent formation of the contact pad 50.

Figure 23:
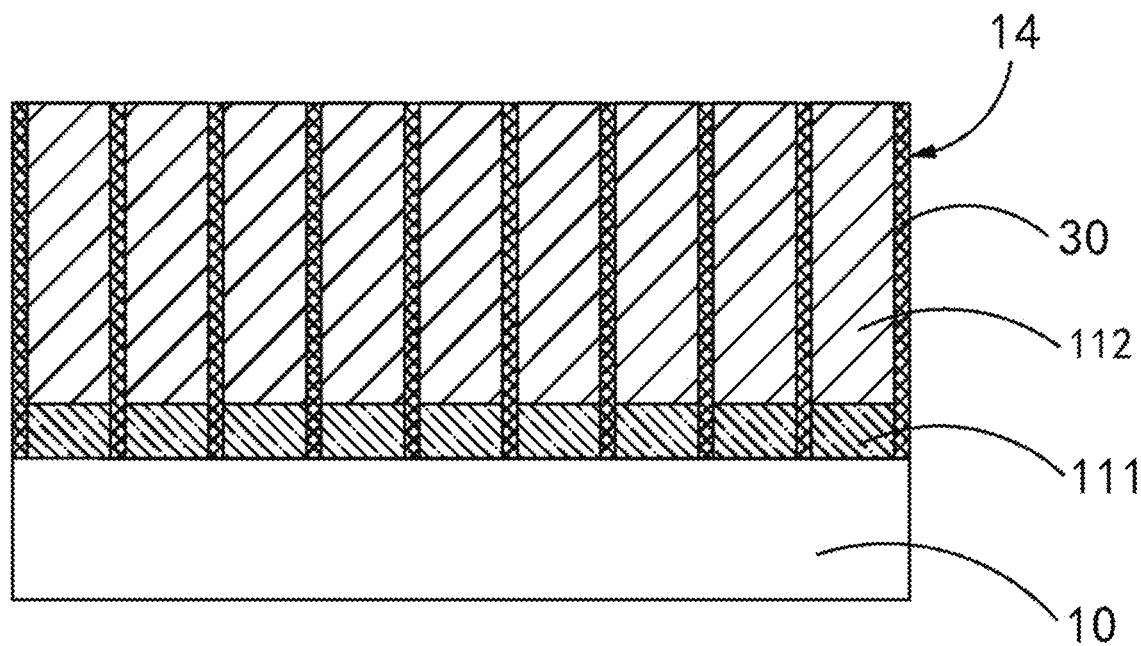
FIG. 23 is a schematic structural diagram of a cross section taken along L-L in FIG. 21.

Specifically, on the basis of FIG. 21 to FIG. 23, the dielectric layer 112, and the bit line contact layer 111 on two sides of the support layer 30 are removed, wherein the remaining bit line contact layer 111 is used as a bit line contact structure 24, wherein the barrier layer 21 covers the bit line contact structure 24.

Figure 24:
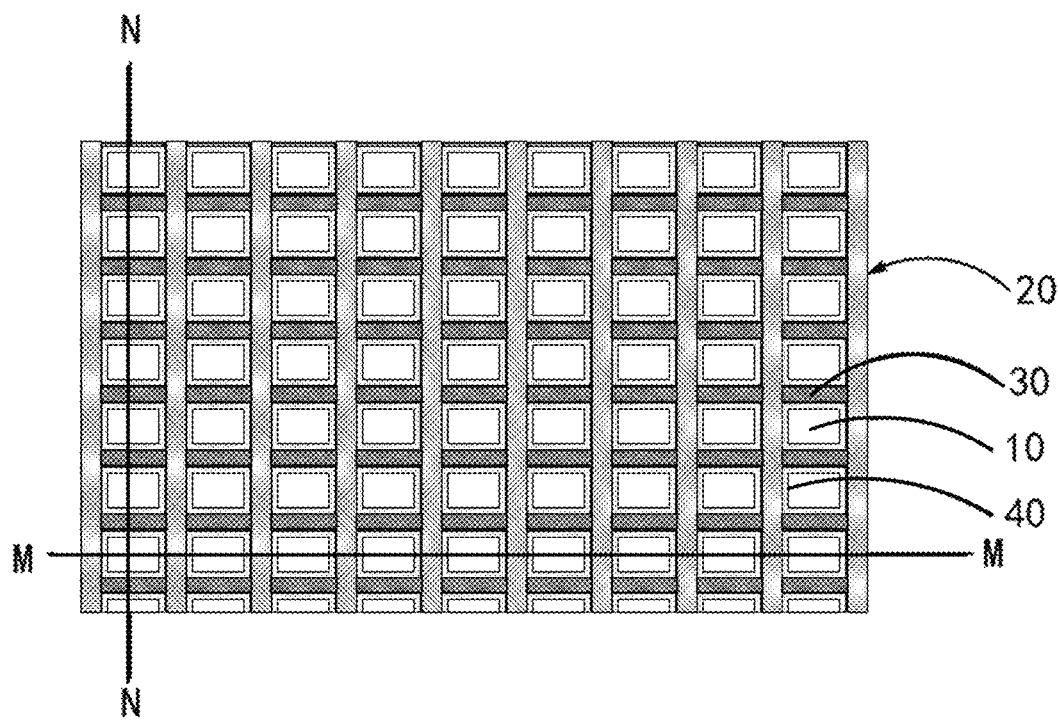
FIG. 24 is a top view of forming a sidewall insulation layer in a method of manufacturing a semiconductor structure according to an exemplary implementation.
Figure 25:
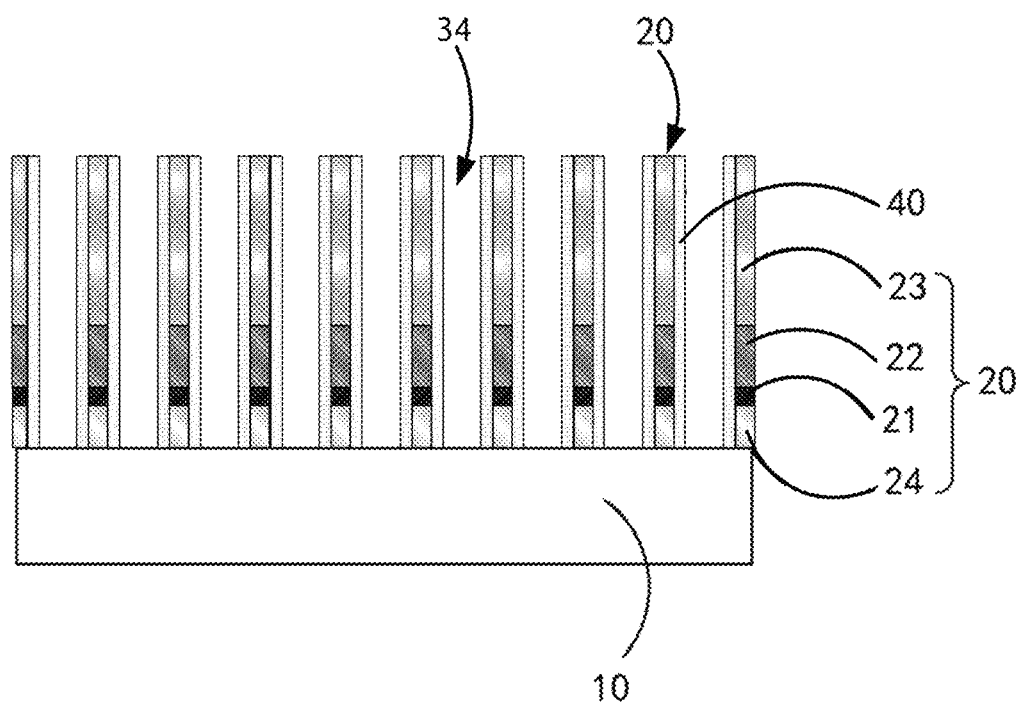
FIG. 25 is a schematic structural diagram of a cross section taken along M-M in FIG. 24.
Figure 26:
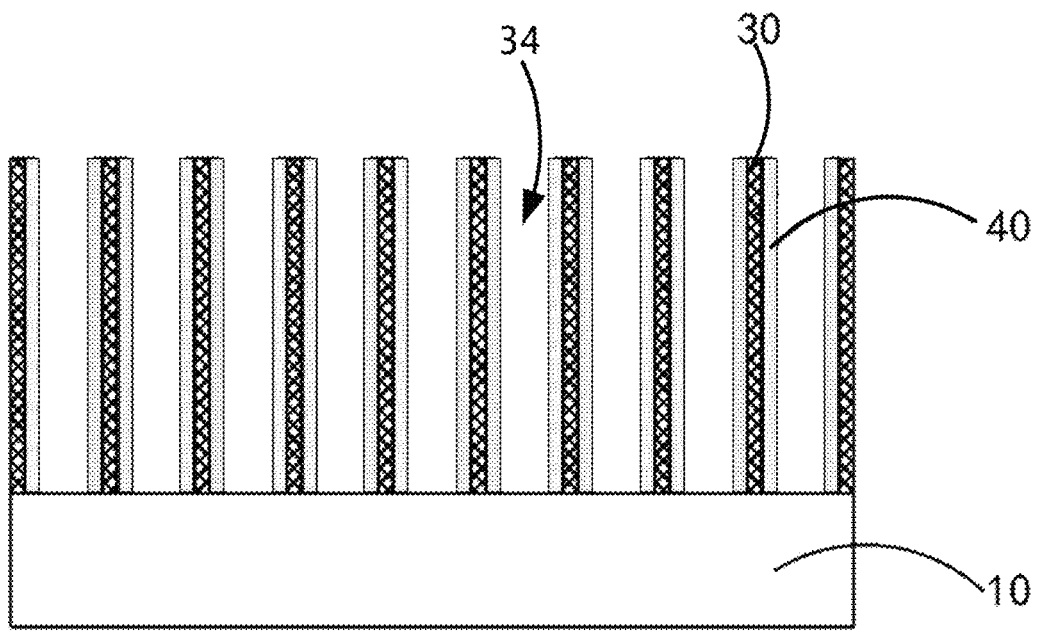
FIG. 26 is a schematic structural diagram of a cross section taken along N-N in FIG. 24.

The sidewall insulation layer 40 is formed on the sidewalls of the bit line 20 and the sidewalls of the support layer 30, to form the structure shown in FIG. 24 to FIG. 26. In this case, the multiple bit lines 20 and the support layers 30 form a mesh structure, and the sidewall insulation layer 40 is formed within the mesh structure.

In some embodiments, after the sidewall insulation layer 40 is formed after formation of the bit line 20 and the support layer 30, that is, the sidewall insulation layer 40 is integrally formed after formation of the bit line 20 and the support layer 30.

In an embodiment, the method of manufacturing a semiconductor structure further includes: forming contact pad 50 within the sidewall insulation layer 40, that is, wherein one of the multiple contact pads 50 is formed in one of the multiple containing spaces 34, to improve the forming efficiency of the semiconductor structure.

The sidewall insulation layer 40 may include silicon nitride (SiN), silicon carbon nitride (SiCN) or other materials. The contact pad 50 may include polysilicon. After polysilicon is filled within the sidewall insulation layer 40, the multiple contact pads 50 are formed by etching back. An upper surface of the contact pad 50 is lower than the top of the bit line 20, to form the structure shown in FIG. 26 to FIG. 29.

The sidewall insulation layer 40 and the contact pad 50 may be formed by using a physical vapor deposition (PVD) process, a chemical vapor deposition (CVD) process, an atomic layer deposition (ALD) process, or the like.

The method of manufacturing a semiconductor structure support layer of the present disclosure provides strong support for the bit line and prevents the bit line from collapsing during manufacturing; moreover, after the bit line is formed, the contact pad is also formed, which simplifies the process steps.

An embodiment of the present disclosure further provides a semiconductor structure. Referring to FIG. 26 to FIG. 29, the semiconductor structure includes: a substrate 10; a bit line 20 located on the substrate 10; and a support layer 30 located on the substrate 10, wherein the support layer 30 includes a first support segment 31 and a second support segment 32, the first support segment 31 and the second support segment 32 are both connected to the bit line 20, and the bit line 20 is located between the first support segment 31 and the second support segment 32.

The semiconductor structure according to an embodiment of the present disclosure includes the substrate 10, the bit line 20, and the support layer 30. The bit line 20 and the support layer 30 intersect each other, such that the bit line 20 is located between the first support segment 31 and the second support segment 32 of the support layer 30. That is, the support layer 30 can support the bit line 20, thereby preventing the bit line 20 from collapsing, thus improving the performance of the semiconductor structure.

Specifically, the bit line 20 is a laminated structure. The bit line 20 includes a bit line contact structure 24, a barrier layer 21, a conductive layer 22, and a covering layer 23, the bit line contact structure 24, the barrier layer 21, the conductive layer 22, and the covering layer 23 are sequentially arranged from bottom to top.

In an embodiment, as shown in FIG. 26 to FIG. 29, the semiconductor structure further includes: a sidewall insulation layer 40, wherein the sidewall insulation layer 40 covers sidewalls of the bit line 20 and sidewalls of the support layer 30, thus forming sidewall insulation.

In an embodiment, the sidewall insulation layer 40 is formed after formation of the bit line 20 and the support layer 30. That is, after the bit line 20 and the support layer 30 is formed, the sidewall insulation layer 40 can be formed integrally, thus improving the manufacturing efficiency of the semiconductor structure.

In an embodiment, a part of the sidewall insulation layer on the bit line 20 and the support layer 30 is of an integrated structure, that is, on the same side of the bit line 20 and the support layer 30, the sidewall insulation layer 40 on the bit line 20 and the sidewall insulation layer 40 on the support layer 30 are connected.

It should be noted that, the integrated structure may be integrally formed, or may indicate that the sidewall insulation layer 40 on the bit line 20 and the sidewall insulation layer 40 on the support layer 30 are connected. The timing for forming the sidewall insulation layer 40 may vary in the manufacturing process; nevertheless, the sidewall insulation layer 40 is formed after formation of the bit line 20 and the support layer 30.

In an embodiment, the material of the support layer 30 and the materials of the sidewall insulation layer 40 include silicon carbide or silicon nitride.

Figure 27:
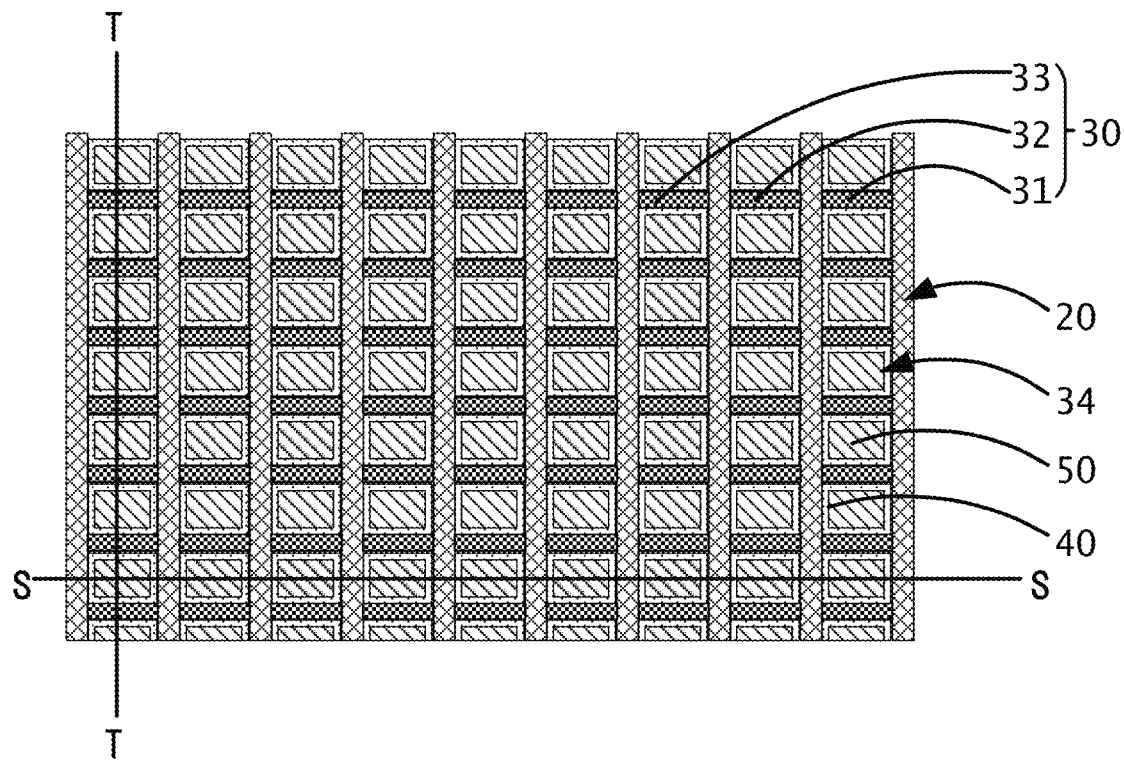
FIG. 27 is a top view of forming contact pads in a method of manufacturing a semiconductor structure according to an exemplary implementation.
Figure 28:
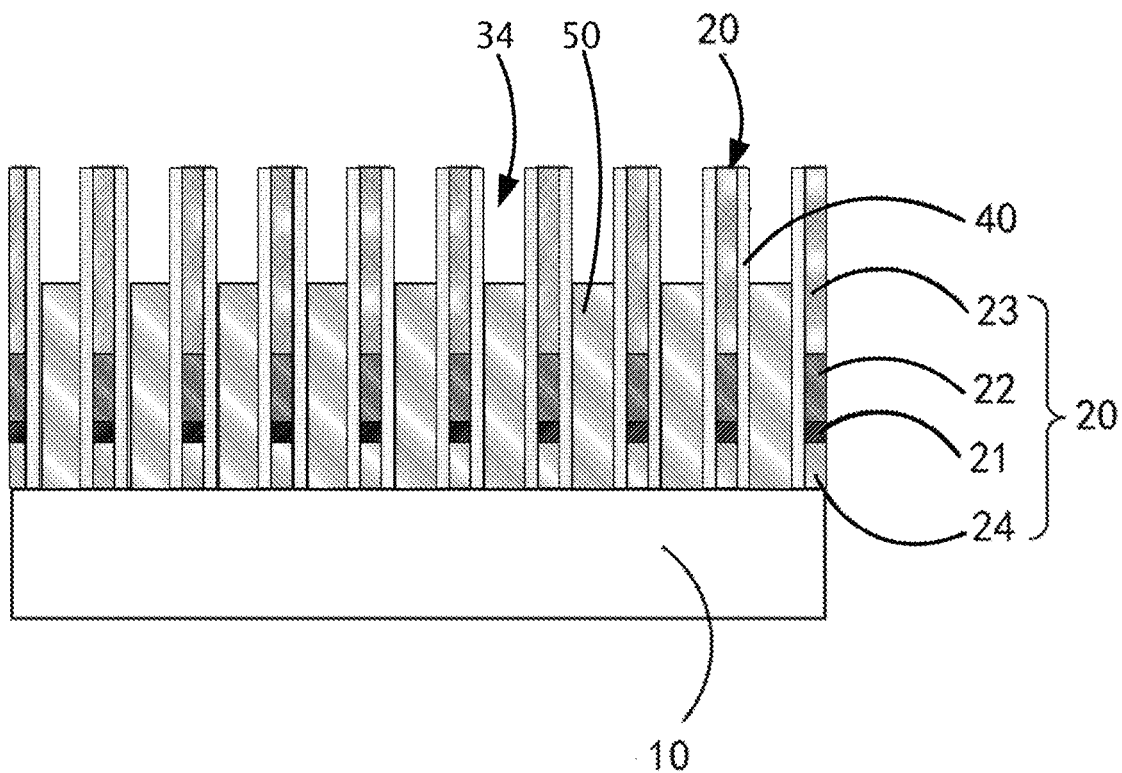
FIG. 28 is a schematic structural diagram of a cross section taken along S-S in FIG. 27.

In an embodiment, as shown in FIG. 27 and FIG. 28, there are multiple bit lines 20, and the multiple bit lines 20 are arranged at intervals along a direction perpendicular to an extension direction of the bit line 20. The support layer 30 further includes a third support segment 33, wherein the first support segment 31, the second support segment 32, and the third support segment 33 are all support segments, and each of the bit lines 20 is located between two adjacent support segments, that is, the support layer 30 implement support for multiple bit lines 20.

Figure 29:
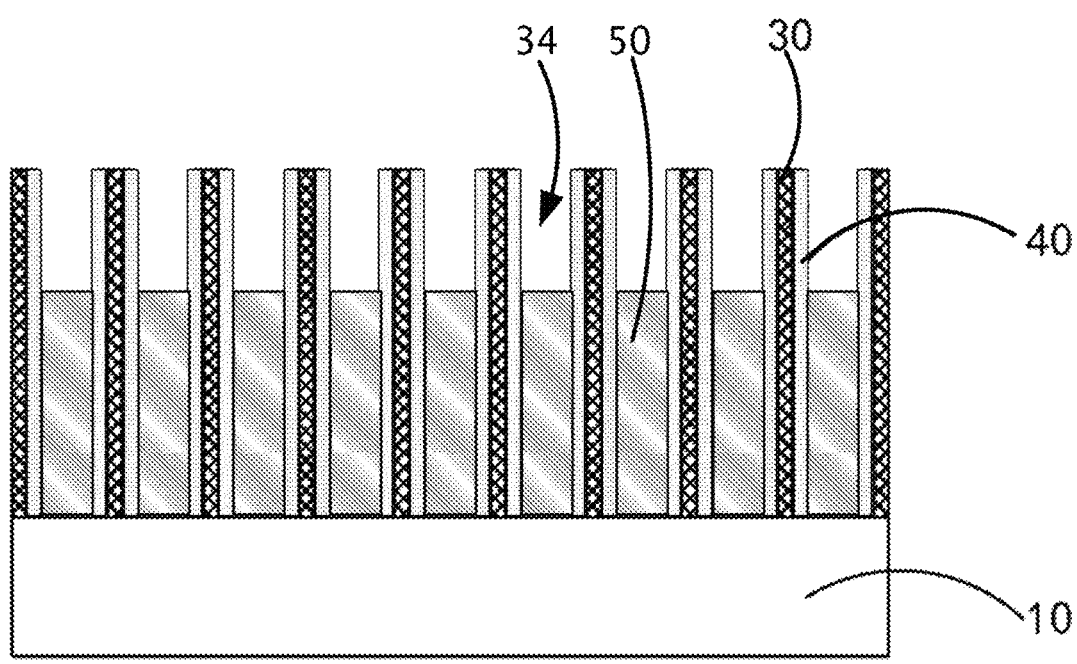
FIG. 29 is a schematic structural diagram of a cross section taken along T-T in FIG. 27.

In an embodiment, as shown in FIG. 27 and FIG. 29, there are multiple support layers 30, and the multiple support layers 30 are arranged at intervals along the extension direction of the bit lines 20, that is, each of the bit lines 20 is supported by multiple support layers 30, thereby improving the stability of the bit lines 20.

In an embodiment, as shown in FIG. 27 and FIG. 29, multiple containing spaces 34 are formed between the multiple bit lines 20 and the multiple support layers 30. The semiconductor structure further includes: multiple contact pads 50, wherein one of the multiple contact pads 50 is located in one of the multiple containing spaces 34. The contact pad 50 are used as capacitor contact node for connecting capacitor.

Optionally, an extension direction of the support layer 30 which is parallel to the substrate 10 may be perpendicular to an extension direction of the bit line 20 which is parallel to the substrate 10, such that the support layer 30 and the bit line 20 form a mesh structure. That is, each of the multiple containing spaces 34 is a rectangular space, the sidewall insulation layer 40 covers sidewalls of the containing space 34 respectively, and the contact pad 50 is wrapped within the sidewall insulation layer 40 respectively. In some embodiments, it is also possible that an angle between the extension direction of the support layer 30 which is parallel to the substrate 10 and the extension direction of the bit line 20 which is parallel to the substrate 10 is not 90 degrees.

In an embodiment, the semiconductor structure can be obtained using the foregoing method of manufacturing a semiconductor structure.

A person skilled in the art may easily think of other implementation solutions of the present disclosure after considering the specification and practicing the content disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and implementations are merely considered as illustrative, and the real scope and spirit of the present disclosure are directed by the appended claims.

It should be noted that, the present disclosure is not limited to the precise structures that have been described above and shown in the accompanying drawings, and can be modified and changed in many ways without departing from the scope of the present disclosure. The scope of the present disclosure is defined by the appended claims.

The invention claimed is:

1. A semiconductor structure, comprising:
    a substrate;
    bit lines located on the substrate; and
    a support layer located on the substrate, wherein an extension direction of the support layer which is parallel to the substrate is perpendicular to an extension direction of the bit lines which is parallel to the substrate, the support layer comprises a first support segment and a second support segment, the first support segment and the second support segment are both connected to an individual one of the bit lines, and the individual one of the bit lines is located between the first support segment and the second support segment, and the first support segment is located between and in direct connection with two adjacent bit lines, the second support segment is located between and in direct connection with two adjacent bit lines.

2. The semiconductor structure according to claim 1, wherein the semiconductor structure further comprises:
    a sidewall insulation layer, wherein the sidewall insulation layer covers sidewalls of the bit lines and sidewalls of the support layer.

3. The semiconductor structure according to claim 2, wherein the sidewall insulation layer is formed after formation of the bit lines and the support layer.

4. The semiconductor structure according to claim 3, wherein the sidewall insulation layer on the bit lines and on the support layer is of an integrated structure.

5. The semiconductor structure according to claim 2, wherein a material of the support layer and a material of the sidewall insulation layer comprise silicon carbide or silicon nitride.

6. The semiconductor structure according to claim 1, wherein
    multiple bit lines are arranged at intervals along a direction perpendicular to an extension direction of the bit lines; and
    the support layer further comprises a third support segment; the first support segment, the second support segment and the third support segment are all support segments, and each of the bit lines is located between two adjacent support segments.

7. The semiconductor structure according to claim 6, wherein there are multiple support layers, and the multiple support layers are arranged at intervals along the extension direction of the bit lines.

8. The semiconductor structure according to claim 7, wherein multiple containing spaces are formed between the multiple bit lines and the multiple support layers, and
    the semiconductor structure further comprises:
    multiple contact pads, wherein one of the multiple contact pads is located in one of the multiple containing spaces.

9. The semiconductor structure according to claim 8, wherein each of the multiple containing spaces is a rectangular space.

10. The semiconductor structure according to claim 8, wherein the semiconductor structure further comprises a sidewall insulation layer, and the sidewall insulation layer covers sidewalls of each of the multiple containing spaces.

11. The semiconductor structure according to claim 1, wherein each of the bit lines is of a laminated structure; each of the bit lines comprises a bit line contact structure, a barrier layer, a conductive layer, and a covering layer; the bit line contact structure, the barrier layer, the conductive layer, and the covering layer are sequentially arranged from bottom to top.

12. A method of manufacturing a semiconductor structure, comprising:
   providing a substrate;
   forming an auxiliary layer on the substrate:
   forming a trench on the auxiliary layer;
   forming a sacrificial layer in the trench; and
   forming openings on the auxiliary layer:
   forming a support layer on the substrate, wherein the sacrificial layer is located between two adjacent openings and the support layer comprises a first support segment and a second support segment; and
   forming a bit line on the substrate, wherein the bit line is formed between the first support segment and the second support segment, and both the first support segment and the second support segment are directly connected to the bit line.

13. The method of manufacturing the semiconductor structure according to claim 12, wherein the sacrificial layer is removed, and at least a part of the bit line is formed in the trench.

14. The method of manufacturing the semiconductor structure according to claim 13, wherein the auxiliary layer comprises a bit line contact layer and a dielectric layer, the bit line contact layer is formed on the substrate, the dielectric layer is formed on the bit line contact layer, the trench exposes the bit line contact layer, and the openings expose the substrate; and forming the bit line comprises:
   forming a barrier layer in the trench;
   forming a conductive layer in the trench, the conductive layer covering the barrier layer;
   forming a covering layer in the trench, the covering layer covering the conductive layer; and
   removing the dielectric layer, and removing the bit line contact layer on two sides of the support layer, a remaining bit line contact layer being used as a bit line contact structure;
   wherein the bit line contact structure, the barrier layer, the conductive layer, and the covering layer are used as the bit line.

15. The method of manufacturing the semiconductor structure according to claim 12, wherein at least one of the trench and the openings are formed by self-aligned double patterning.

16. The method of manufacturing the semiconductor structure according to claim 12, further comprising:
   forming a sidewall insulation layer on the substrate, the sidewall insulation layer covering sidewalls of the bit line and sidewalls of the support layer.

17. The method of manufacturing the semiconductor structure according to claim 16, wherein the sidewall insulation layer is formed after formation of the bit line and the support layer.

18. The method of manufacturing the semiconductor structure according to claim 16, further comprising:
   forming contact pads within the sidewall insulation layer.

* * * * *